United States Patent
Oohashi et al.

(10) Patent No.: US 7,265,315 B2
(45) Date of Patent: Sep. 4, 2007

(54) METHOD OF JOINING TERMINALS BY SOLDERING

(75) Inventors: Atsushi Oohashi, Tokyo (JP);
Shoichiro Nishitani, Tokyo (JP);
Takahiro Yamada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/963,570

(22) Filed: Oct. 14, 2004

(65) Prior Publication Data

US 2005/0274704 A1 Dec. 15, 2005

(30) Foreign Application Priority Data

Jun. 10, 2004 (JP) .............................. 2004-172252

(51) Int. Cl.
*B23K 26/20* (2006.01)
*B23K 26/42* (2006.01)

(52) U.S. Cl. ........................... 219/121.66; 219/121.85; 219/121.86; 228/179.1; 228/222; 228/232

(58) Field of Classification Search ........... 219/121.64, 219/121.66, 121.82, 85.13, 85.18, 121.65, 219/121.85, 121.86; 228/179.1, 222, 232
See application file for complete search history.

(56) References Cited

U.S. PATENT DOCUMENTS

| | | | | |
|---|---|---|---|---|
| 3,824,679 A * | 7/1974 | Mosch et al. | .................. | 29/854 |
| 3,972,463 A * | 8/1976 | Conlon et al. | ............. | 228/44.7 |
| 4,097,704 A * | 6/1978 | Piber | .......................... | 307/126 |
| 4,327,800 A * | 5/1982 | Miller | .......................... | 165/79 |
| 4,328,921 A * | 5/1982 | Liang | .......................... | 228/222 |
| 4,531,044 A * | 7/1985 | Chang | .................. | 219/121.85 |
| 4,631,805 A * | 12/1986 | Olsen et al. | ................. | 438/123 |
| 4,945,953 A * | 8/1990 | Kronberg | ..................... | 140/105 |
| 5,346,327 A * | 9/1994 | Herbert | ..................... | 403/272 |
| 5,980,270 A * | 11/1999 | Fjelstad et al. | ............... | 439/71 |
| 6,088,234 A * | 7/2000 | Ishikawa et al. | ............ | 361/760 |
| 6,250,259 B1 * | 6/2001 | Herz et al. | ................... | 122/511 |
| 6,493,932 B1 * | 12/2002 | Haba | .......................... | 29/840 |
| 6,503,777 B2 * | 1/2003 | Jackson | ..................... | 438/106 |
| 6,628,800 B2 * | 9/2003 | Tajima | ..................... | 381/417 |
| 6,651,870 B2 * | 11/2003 | Teshima et al. | ............ | 228/246 |
| 6,774,526 B2 * | 8/2004 | Furuya et al. | ............... | 310/233 |
| 2002/0034582 A1 * | 3/2002 | Eldridge | ..................... | 427/96 |
| 2004/0228036 A1 * | 11/2004 | Yamaguchi | ............... | 360/234.5 |

FOREIGN PATENT DOCUMENTS

| | | |
|---|---|---|
| DE | 004116204 A1 * | 11/1992 |
| JP | 361014032 A * | 1/1986 |
| JP | 363043788 A * | 2/1988 |
| JP | 363203269 A * | 8/1988 |
| JP | 401205869 A * | 8/1989 |

(Continued)

*Primary Examiner*—Samuel M. Heinrich
(74) *Attorney, Agent, or Firm*—Sughrue Mion, PLLC (57) ABSTRACT

A method of joining terminals by soldering is provided which allows control of increasing gas supply even in soldering performed in a gas atmosphere within a gas chamber. Utilizing a springback phenomenon occurring at a flat portion of a terminal, a solder joint of the terminal is immersed in molten solder. Then, laser soldering is performed using a gas chamber made of a material which transmits a laser beam at least in part.

6 Claims, 5 Drawing Sheets

FOREIGN PATENT DOCUMENTS

| | | | | |
|---|---|---|---|---|
| JP | 403038833 A | * | 2/1991 |
| JP | 403124368 A | * | 5/1991 |
| JP | 406077638 A | * | 3/1994 |
| JP | 407183654 A | * | 7/1995 |
| JP | 409064151 A | * | 3/1997 |
| JP | 2768141 B2 | | 4/1998 |
| JP | 410193161 A | * | 7/1998 |
| JP | 02000216171 A | * | 8/2000 |

* cited by examiner

METHOD OF JOINING TERMINALS BY SOLDERING

BACKGROUND OF THE INVENTION

1. Field of the Invention

The present invention relates to a method of joining terminals to a printed circuit board by soldering.

2. Description of the Background Art

Various methods exist for joining terminals to a printed circuit board. For example, Japanese Patent No. 2768141 describes a technique using laser welding.

Instead of laser welding as in the aforementioned Japanese Patent, soldering using laser heating can also be employed to join terminals to a printed circuit board.

In soldering, a flux may be used for purposes such as prevention of oxidation and removal of oxides. Or, a silicone gel may be applied onto a printed circuit board after soldering for purposes such as assurance of insulation and shock absorption. There are also cases where a flux and a silicone gel are used in combination; for example, soldering using a flux is followed by the application of a silicone gel on a printed circuit board.

In the combined use of a flux and a silicone gel, however, hardening of the silicone gel may easily be inhibited by the influence of flux residues on a printed circuit board. Thus, a cleaning process is required for removal of flux residues from on top of the surface of a printed circuit board.

A cleaner is however an expensive and large-scale equipment; thus, the introduction of a flux cleaning process will complicate the configuration of a manufacturing line and therefore will increase equipment expenses.

From the above, fluxless soldering techniques have also been devised. The fluxless soldering techniques need no flux cleaning process from the very first, and thus, eliminate the need for a cleaner, in which case the hardening of a silicone gel is not inhibited. Such techniques include performing soldering in an atmosphere of a gas mixture of an inert gas such as nitrogen and a reducing gas such as hydrogen to reduce and remove oxides from solder surfaces. Here, the gas atmosphere is realized by blowing a gas onto solder joints or by performing soldering within a gas chamber filled with a gas.

However, the problem with the case of blowing a gas is that solder and terminals are cooled by gas injection and thus the solder is hard to melt. On the other hand, the case of creating a gas atmosphere within a gas chamber does not have such a cooling problem, but in this case, an insertion port for the introduction of a soldering jig and an opening for the admission of a laser beam must be provided within a gas chamber. Since a leakage of gas from such an insertion port for a jig and such an opening for a laser beam is inevitable, an increasing supply of gas becomes an issue.

SUMMARY OF THE INVENTION

An object of the present invention is to provide a method of joining terminals by soldering, the method allowing control of increasing gas supply even in soldering performed in a gas atmosphere within a gas chamber.

According to a first aspect of the present invention, the method of joining terminals by soldering includes the following steps (a) through (d). The step (a) is to prepare a terminal having a flat portion and a solder joint, and a substrate on which solder has previously been applied. The step (b) is to press the solder joint of the terminal against the solder in order to bend the flat portion. The step (c) is to heat the solder joint of the terminal. The step (d) is to stop the heating of the solder joint after immersing the solder joint of the terminal into the solder that is molten by the heating by utilizing springback of the flat portion.

Utilizing springback of the flat portion, the heating of the solder joint is stopped after immersion of the solder joint of the terminal in the solder that is molten by the heating. This eliminates the need to provide a jig for pressing the solder joint of the terminal in the molten solder, thereby facilitating soldering. Also, when soldering is performed in a gas atmosphere, there is no need to provide an insertion port for a jig within a gas chamber. This, as a result, reduces the occurrence of gas leakages and allows control of increasing gas supply.

According to a second aspect of the present invention, the method of joining terminals by soldering includes the following steps (a) through (d). The step (a) is to prepare a terminal having a solder joint, a substrate on which solder has previously been applied, a laser beam source that is capable of emitting a laser beam, and a gas chamber that is made of a material which transmits the laser beam at least in part. The step (b) is to bring the terminal and the substrate into the gas chamber, with the solder and the solder joint of the terminal in contact with each other, and to fill the gas chamber with a gas including an inert gas or a gas mixture of an inert gas and a reducing gas. The step (c) is to heat the solder joint of the terminal by emitting the laser beam from the laser beam source and by applying the laser beam which transmits the gas chamber, to the solder joint. The step (d) is to stop the heating of the solder joint after immersing the solder joint of the terminal into the solder that is molten by the heating.

The solder joint of the terminal is heated by emitting the laser beam from the laser beam source and by applying the laser beam which transmits the gas chamber, to the solder joint. Thus, there is no need to provide an opening for the admission of the laser beam within the gas chamber. This, as a result, reduces the occurrence of gas leakages and allows control of increasing gas supply.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment of the present invention provides a method of joining terminals by soldering, wherein solder joints of terminals are immersed in molten solder utilizing a springback phenomenon that occurs at flat portions of the terminals, and laser soldering is performed using a gas chamber that is made of a material which transmits a laser beam at least in part.

The utilization of the springback phenomenon eliminates the need to use a jig for pressing solder joints of terminals into molten solder and thus eliminates the need to provide an insertion port for such a jig within a gas chamber. Also, there is no need to provide an opening for the admission of a laser beam within a gas chamber. This results in the realization of a terminal joining method that reduces the occurrence of gas leakages and that allows control of increasing gas supply.

Figure 1:
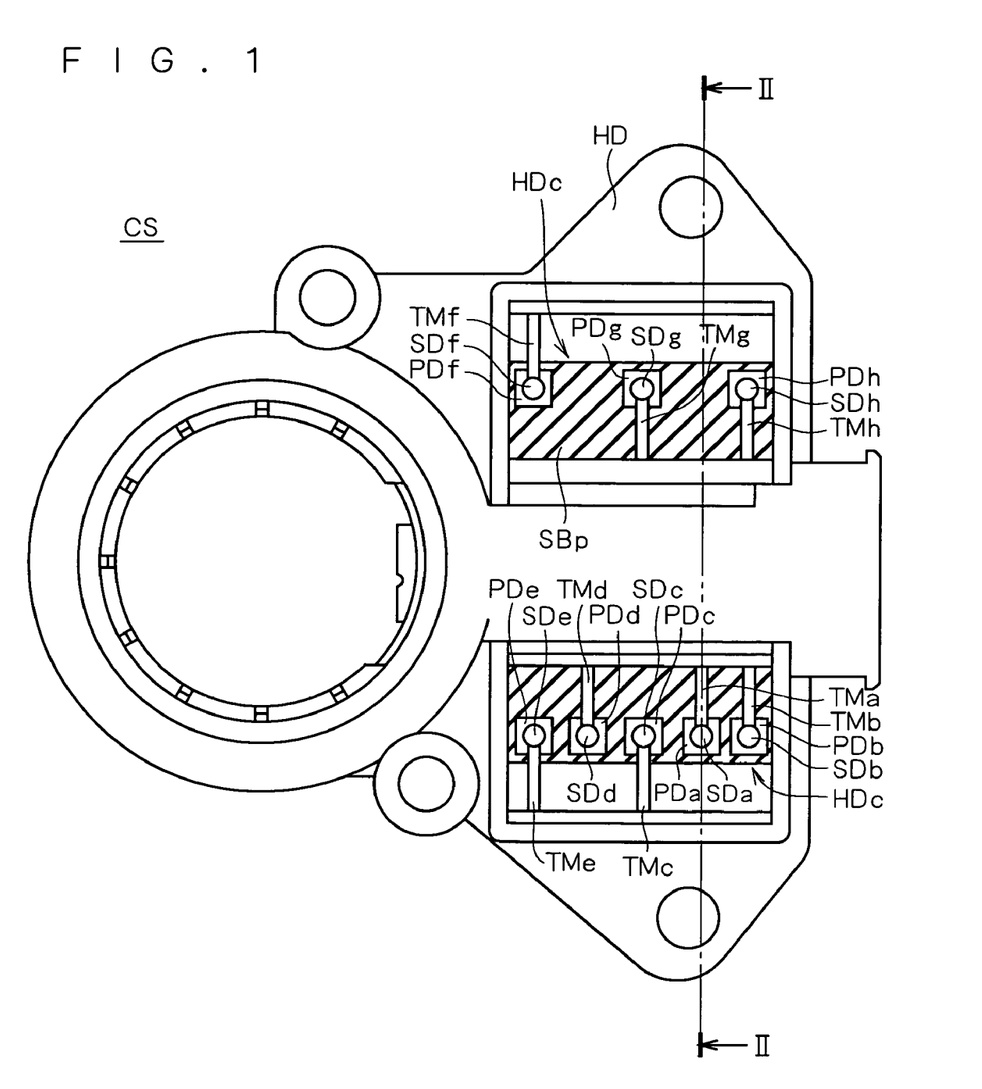
FIG. 1 is a top plan view showing the structure of a vehicle alternator component, to which a method of joining terminals by soldering according to a preferred embodiment of the present invention is applied.
Figure 2:
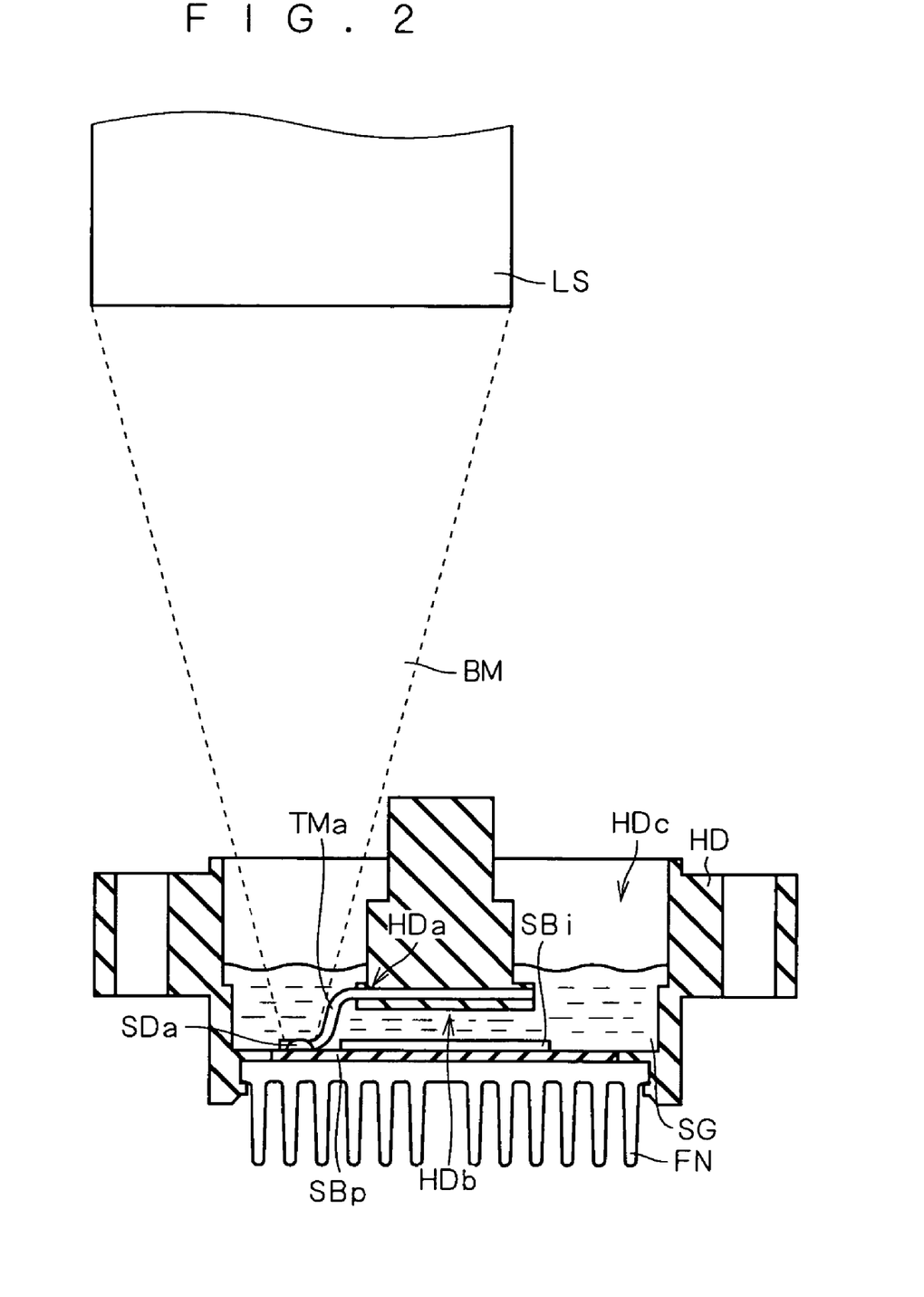
FIG. 2 is a cross-sectional view taken along section line II-II in FIG. 1.

FIG. 1 is a top plan view showing the structure of a vehicle alternator component CS to which the terminal joining method according to this preferred embodiment is applied. FIG. 2 is a cross-sectional view taken along section line II-II in FIG. 1.

As shown in FIGS. 1 and 2, the vehicle alternator component CS include a brush holder HD having therein surface cavities HDc and a bottom cavity HDb. There are two surface cavities HDc in the surface of the brush holder HD and both the surface cavities HDc are connected to the bottom cavity HDb. In the bottom cavity HDb, brush holder terminals TMa through TMh that project from the brush holder HD are exposed. The brush holder terminals TMa through TMh are, for example, plate terminals made of copper alloys.

At the bottom of the brush holder HD, a cooling fin FN is mounted to cover the bottom cavity HDb. A surface of the cooling fin FN which faces the bottom cavity HDb is bonded to a printed circuit board SBp. Also, an IC (Integrated Circuit) substrate SBi where a power transistor and the like is formed is bonded onto the printed circuit board SBp.

On the printed circuit board SBp, pads PDa through PDh that are connected to printed wiring (not shown) are provided. The brush holder terminals TMa through TMh and their corresponding pads PDa through PDh are bonded with solders SDa through SDh, respectively. After soldering, a silicone gel SG is filled in the bottom cavity HDb.

Figure 3:
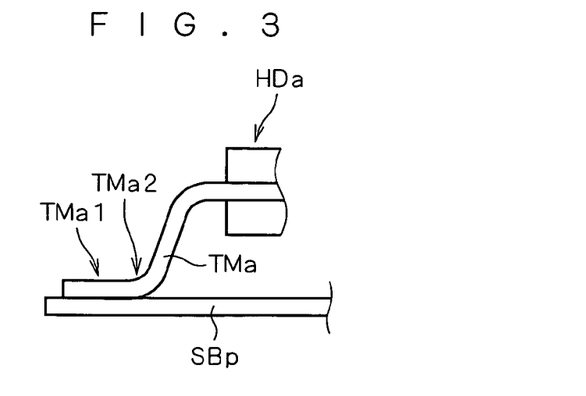
FIG. 3 is a diagram illustrating a design configuration of a brush holder terminal with no solder application.

FIGS. 3 through 6 are diagrams for explaining the method of joining terminals by soldering according to this preferred embodiment, taking as an example the brush holder terminal TMa. First, as shown in FIG. 3, the shape of a bent portion TMa2 of the brush holder terminal TMa and the shape of projection of the brush holder terminal TMa from a brush holder end HDa are designed such that a solder joint TMa1 of the brush holder terminal TMa is in broad contact with the printed circuit board SBp when the solder SDa has not been applied yet.

Then, the printed circuit board SBp is prepared in which the solder SDa has previously been applied on the pad PDa. This printed circuit board SBp is bonded to the cooling fin FN in such a manner that, as shown in FIG. 2, the cooling fin FN is mounted at the bottom of the brush holder HD where the brush holder terminal TMa has been formed.

Figure 4:
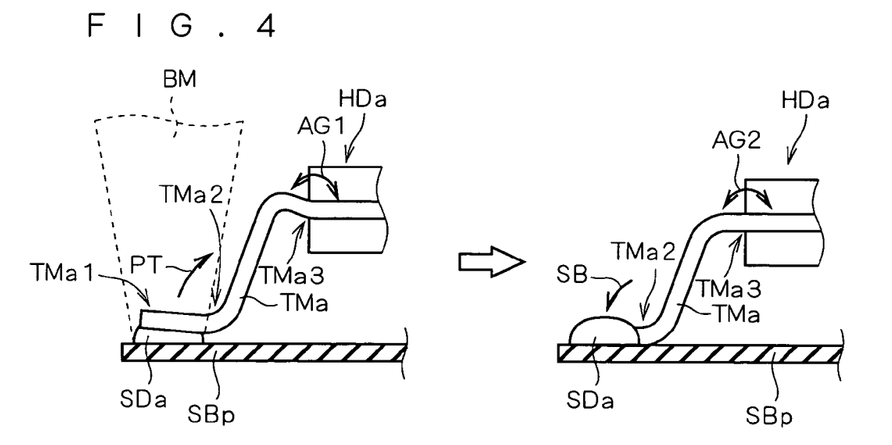
FIG. 4 is a diagram illustrating the method of joining terminals by soldering according to the preferred embodiment of the present invention.

This mounting causes the solder joint TMa1 of the brush holder terminal TMa to be pressed against the solder SDa, by which the solder joint TMa1 is subjected to stress PT as shown in the left side of FIG. 4. Accordingly, a flat portion TMa3 of the brush holder terminal TMa in the vicinity of the brush holder end HDa is bent at an angle AG1, with the root of the brush holder terminal TMa, supported by the brush holder end HDa, as the fulcrum. While the flat portion TMa3 in FIG. 4 is in a horizontal position, this is not an absolute necessity and a similar effect can also be seen with the flat portion TMa3 that is in inclined position.

Then, a laser beam BM is emitted from a laser beam source and is applied to the solder joint TMa1 of the brush holder terminal TMa. Thereby, the solder joint TMa1 is heated. The laser beam source and the laser beam are also shown in FIG. 2, respectively as LS and BM.

As the solder SDa is molten by the heating of the solder joint TMa1, the stress PT applied on the solder joint TMa1 decreases rapidly. Thus, as shown in the right side of FIG. 4, by reaction forces SB against the stress PT, the bending angle AG1 of the flat portion TMa3 of the brush holder terminal TMa returns to an angle AG2 that is horizontal to a direction of extension of the flat portion TMa3. That is, the brush holder terminal TMa returns to its design shape as shown in FIG. 3. This phenomenon is called "springback," which is well known in the field of metal processing.

Figure 5:
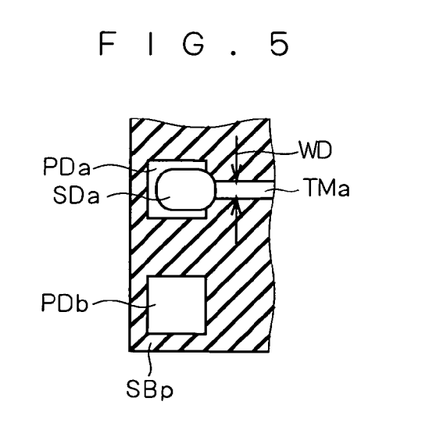
FIG. 5 is a top plan view showing the right side of FIG. 4.

Accordingly, after the melting of the solder SDa, the solder joint TMa1 of the brush holder terminal TMa is immersed in the solder SDa by the springback phenomenon occurring at the flat portion TMa3 of the brush holder terminal TMa. FIG. 5 illustrates the solder joint TMa1 of the brush holder terminal TMa being immersed in the solder SDa.

In this condition, the heating by the emission of the laser beam BM is stopped.

Figure 6:
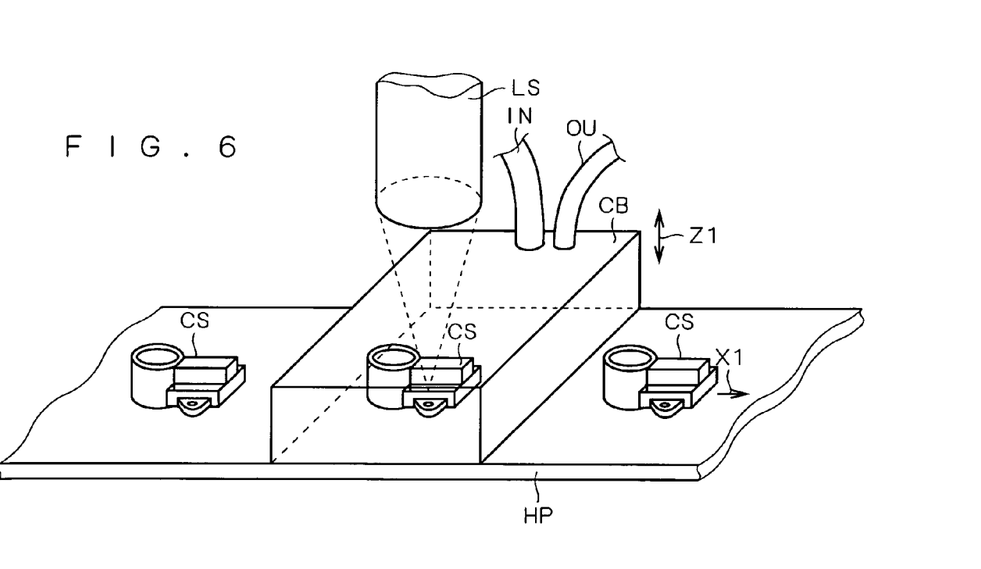
FIG. 6 is a diagram for explaining laser soldering using a gas chamber.

The soldering by means of the laser beam BM emitted from the laser beam source LS is performed after bringing the vehicle alternator component CS into a gas chamber CB filled with a gas, as shown in FIG. 6. During the soldering, the gas chamber CB has an atmosphere of an inert gas such as nitrogen ($N_2$) or of a gas mixture of the inert gas and a reducing gas such as hydrogen ($H_2$).

The gas chamber CB is movable in the direction Z1 of the arrow in FIG. 6, i.e., in the direction perpendicular to a direction X1 of flow of the manufacturing line, and is capable of sealing one of the vehicle alternator component CS which is carried by a conveyor plate HP (the conveyor plate HP being movable in the direction X1 of flow of the manufacturing line), with the conveyor plate HP as the bottom surface.

The gas chamber CB is provided with a gas supply conduit IN and a gas suction conduit OU through which a gas is introduced into and discharged from the gas chamber CB, respectively. Thus, the vehicle alternator component CS can be exposed to a gas atmosphere including a reducing gas by moving the gas chamber CB downward to seal the vehicle alternator component CS and then by sucking out air from the gas chamber CB and introducing a gas mixture of nitrogen ($N_2$) and hydrogen ($H_2$) thereinto through the gas supply conduit IN.

A part of the gas chamber CB which is irradiated with the laser beam BM is made of a material that transmits the laser beam BM emitted from the laser beam source LS. For example when a visible-light wavelength laser using a Xe lamp or an AlGaAs semiconductor laser is adopted as the laser beam source LS, the gas chamber CB is made of glass, for example.

From this, when the soldering of the solder joint TMa1 of the brush holder terminal TMa is performed by emission of the laser beam BM from the laser beam source LS, the laser beam BM passes through the gas chamber CB.

According to the method of joining terminals by soldering of this preferred embodiment, after the solder joint TMa1 of the brush holder terminal TMa is immersed in the heated and molten solder SDa utilizing the springback of the flat portion TMa3 of the brush holder terminal TMa, the heating is stopped. Thus, the soldering is readily performed without requiring a jig for pressing the solder joint TMa1 of the brush holder terminal TMa into the molten solder SDa. And, there is no need to provide an insertion port for such a jig within the gas chamber CB. This reduces the occurrence of gas leakages and allows control of increasing gas supply.

Further according to the method of joining terminals by soldering of this preferred embodiment, the solder joint TMa1 is heated by emitting the laser beam BM from the laser beam source LS and by applying the laser beam BM, which passes through the gas chamber CB, to the solder joint TMa1 of the brush holder terminal TMa. Thus, there is no need to provide an opening for the admission of the laser beam BM into the gas chamber CB. This also reduces the occurrence of gas leakages and allows control of increasing gas supply.

A diameter of irradiation of the solder joint TMa1 of the brush holder terminal TMa with the laser beam BM should preferably be approximately equal to the width (shown as WD in FIG. 5) of the solder joint TMa1.

Then the solder joint TMa1 of the brush holder terminal TMa can effectively receive the energy of the laser beam BM.

Figure 7:
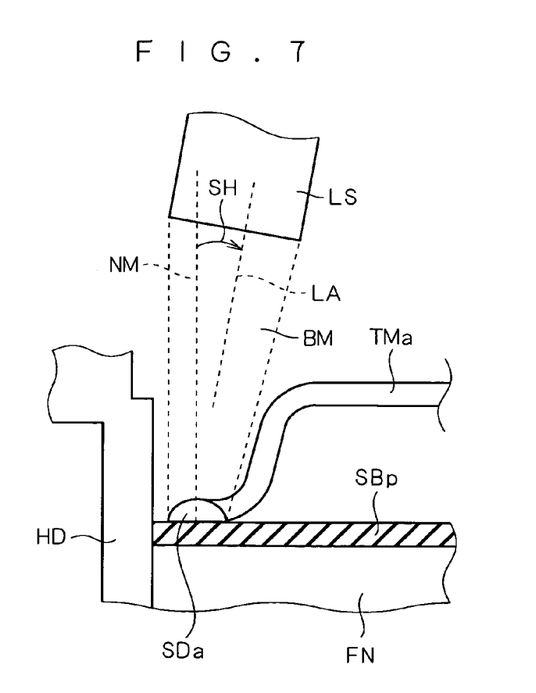
FIG. 7 is a diagram showing that a brush holder terminal is soldered at the edge of a printed circuit board.

Further, as shown in FIG. 7, an optical axis LA of the laser beam BM may be inclined by an amount of shift SH with respect to a direction NM of the normal to the surface of the solder joint TMa1 of the brush holder terminal TMa.

This prevents the interception of the laser beam BM due to the presence of, for example, the side wall of the brush holder HD, even when the brush holder terminal TMa is soldered at the edge of the printed circuit board SBp as shown in FIG. 7.

The conveyor plate HP which carries the vehicle alternator component CS may be formed of a heatable hot plate, and prior to the heating of the solder joint TMa1 of the brush holder terminal TMa, the printed circuit board SBp may be heated via the cooling fin FN using the conveyor plate HP in order to preliminarily heat the brush holder terminal TMa to an extent where the solder SDa is not molten.

For example if the brush holder terminal TMa is preliminarily heated to approximately 100° C., the soldering time can be reduced to approximately 0.5 second, whereas soldering without preliminary heating takes approximately 3 seconds. Thus, the time required for solder to melt is shortened, which contributes to improved productivity.

Further, solder plating may be applied to the surface of the brush holder terminal TMa.

The application of solder plating to the surface of the brush holder terminal TMa will increase the wettability of the solder SDa and will prevent the occurrence of bond failure. Accordingly, high bonding strength is maintained between the brush holder terminal TMa and the printed circuit board SBp after soldering.

While the brush holder terminal TMa is made of copper alloys, other metallic materials may be chosen as the material thereof. Also, the brush holder terminal TMa is not restricted to having a plate-like shape, but it may have a pin-like shape, for example.

Figure 8:
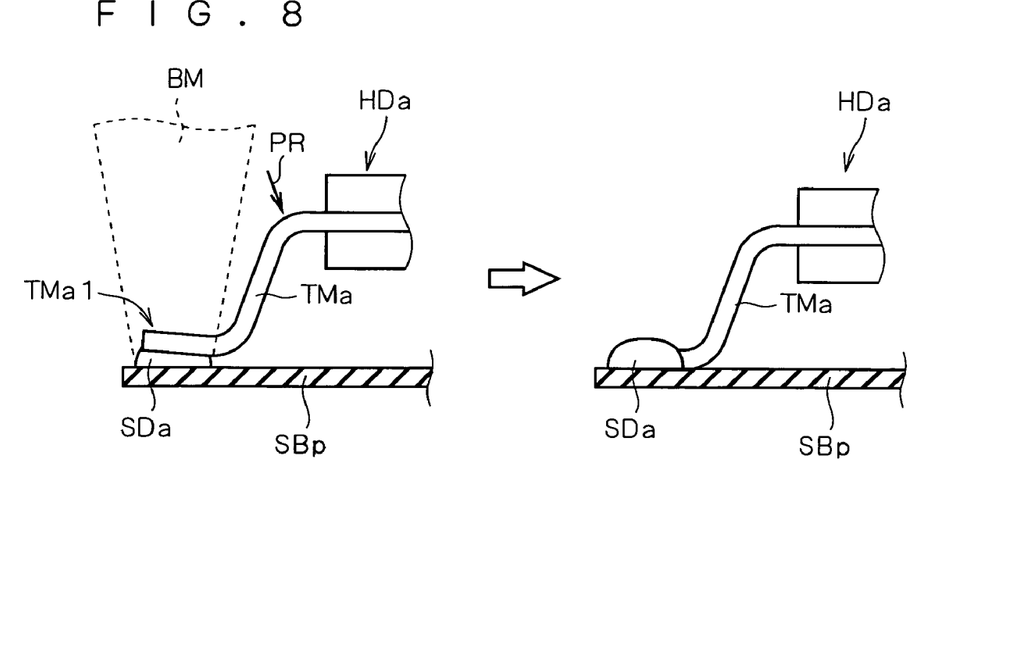
FIG. 8 is a diagram showing that the brush holder terminal is immersed in solder by the application of pressure using a jig.

While this preferred embodiment shows an example where springback is utilized to immerse the brush holder terminal TMa in the solder SDa, it does not eliminate the possibility that, as shown in FIG. 8, the brush holder terminal TMa is immersed in the solder SDa by the application of pressure PR to the brush holder terminal TMa, using a jig (not shown).

This is because, when a very small jig is used and only a small insertion port for such a jig is provided within the gas chamber CB, the degree of gas leakages is considered relatively small.

Now, the concentration of oxygen ($O_2$) gas within the gas chamber CB should preferably be equal to or less than 500 ppm by volume.

Figure 9:
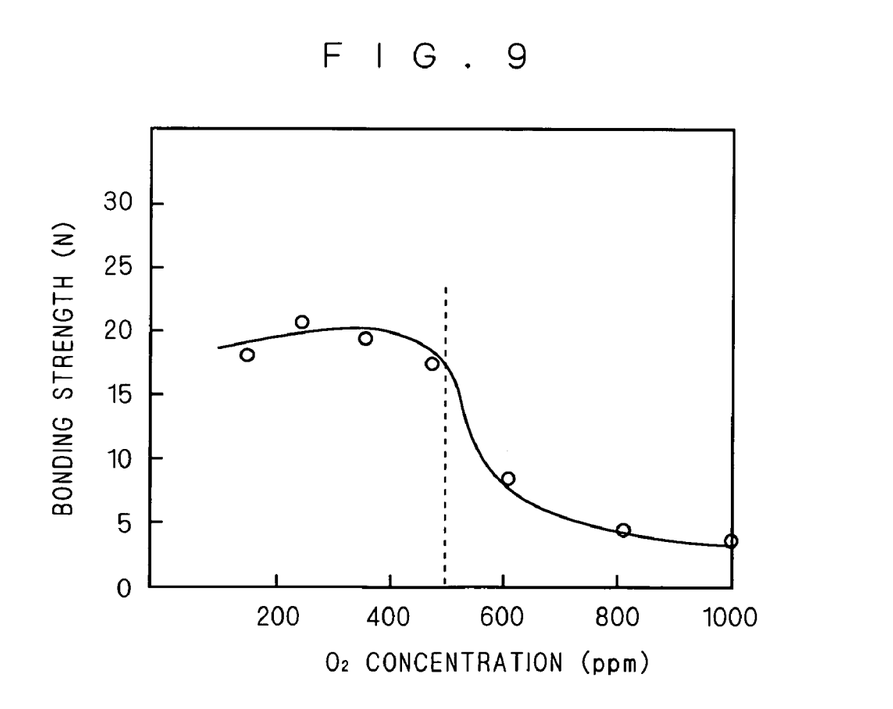
FIG. 9 is a graph in which the abscissa represents the concentration of residual oxygen ($O_2$) gas within a gas chamber and the ordinate represents the bonding strength of the brush holder terminal.

FIG. 9 is a graph in which the abscissa represents the concentration of residual oxygen ($O_2$) gas (in parts per million (ppm)) within the gas chamber CB and the ordinate represents the bonding strength (in Newtons (N)) of the brush holder terminal TMa. The bonding strength is determined by a tension test that is conducted by drawing the soldered brush holder terminal TMa in a direction perpendicular to the surface of the printed circuit board SBp.

As can be seen from the graph, a high bonding strength is maintained at the oxygen gas concentrations of 500 ppm or less. This is believed to be due to the fact that oxides on the surface of the brush holder terminal TMa are removed by a reducing process at the oxygen gas concentrations of 500 ppm or less, but that the reducing process of oxides does not work at the oxygen gas concentrations exceeding 500 ppm.

Thus, at the oxygen ($O_2$) gas concentrations of not more than 500 ppm by volume within the gas chamber CB, the wettability of the solder SDa is improved and thus bond failure is unlikely to occur, since oxides on the surface of the brush holder terminal TMa are removed by the reducing process. Accordingly, high bonding strength is maintained between the terminals and the substrate after soldering.

While the above description is given by taking the brush holder terminal TMa as an example, similar processes are also performed for the other brush holder terminals TMb through TMh. Thus, the descriptions of soldering of the brush holder terminals TMb through TMh are omitted herein.

While the invention has been shown and described in detail, the foregoing description is in all aspects illustrative and not restrictive. It is therefore understood that numerous modifications and variations can be devised without departing from the scope of the invention.

What is claimed is:

1. A method of joining terminals by soldering, comprising the steps of:
   (a) preparing a terminal having a flat portion and a solder joint portion, providing a substrate on which solder has previously been applied, mounting a cooling fin on said substrate, providing a laser beam source that is capable of emitting a laser beam, and providing a gas chamber that is made of a material which transmits said laser beam at least in part;
   (b) pressing said solder joint portion of said terminal against said solder in order to bend said flat portion, and bringing said terminal and said substrate into said gas chamber with said solder and said solder joint of said terminal in contact with each other, and filling said gas chamber with a gas including an inert gas or a gas mixture of an inert gas and a reducing gas;
   (c) heating said solder joint portion of said terminal by emitting said laser beam from said laser beam source so as to pass through the material of said gas chamber and by applying said laser beam to said solder joint portion;

(d) stopping said heating of said solder joint portion, after immersing said solder joint portion of said terminal into said solder that is molten by said heating by utilizing springback of said flat portion; and (e) prior to said step (c), preheating said cooling fin so that said terminal is preliminarily heated via conduction through said substrate.

2. The method according to claim 1, wherein said terminal is preliminarily heated to an extent where said solder is not molten.

3. The method according to claim 1, wherein solder plating is applied to a surface of said terminal.

4. The method according to claim 1, wherein in said step (c), an optical axis of said laser beam is inclined with respect to a direction normal to a surface of said solder joint portion of said terminal.

5. The method according to claim 1, wherein in said step (b), an oxygen ($O_2$) gas concentration within said gas chamber is not more than 500 ppm by volume.

6. The method according to claim 1, wherein in said step (c), a diameter of irradiation of said solder joint portion of said terminal with said laser beam is approximately equal to a width of said solder joint portion.

* * * * *